United States Patent
Zhang (10) Patent No.: US 11,087,981 B2
(45) Date of Patent: Aug. 10, 2021

(54) POLY-SILICON LAYER AND METHOD OF MANUFACTURING THE SAME, METHODS OF MANUFACTURING THIN FILM TRANSISTOR AND ARRAY SUBSTRATE

(71) Applicant: BOE TECHNOLOGY GROUP CO., LTD., Beijing (CN)

(72) Inventor: Huijuan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 16/349,780

(22) PCT Filed: Nov. 7, 2018

(86) PCT No.: PCT/CN2018/114308
§ 371 (c)(1),
(2) Date: May 14, 2019

(87) PCT Pub. No.: WO2019/205569
PCT Pub. Date: Oct. 31, 2019

(65) Prior Publication Data
US 2020/0273703 A1    Aug. 27, 2020

(30) Foreign Application Priority Data

Apr. 28, 2018   (CN) .......................... 201810402853.6

(51) Int. Cl.
*H01L 21/20* (2006.01)
*H01L 21/84* (2006.01)
(Continued)

(52) U.S. Cl.
CPC .. *H01L 21/02675* (2013.01); *H01L 21/02532* (2013.01); *H01L 21/02592* (2013.01); *H01L 27/1274* (2013.01); *H01L 29/66757* (2013.01)

(58) Field of Classification Search
CPC ........... H01L 27/1281; H01L 21/02675; H01L 21/2026
See application file for complete search history.

(56) References Cited

U.S. PATENT DOCUMENTS 6,569,716 B1    5/2003  Suzuki
6,602,765 B2 *  8/2003  Jiroku ................. H01L 21/2026
                                                            438/487
(Continued)

FOREIGN PATENT DOCUMENTS

CN    101071793 A    11/2007
CN    107068552 A    8/2017
(Continued)

OTHER PUBLICATIONS

International Search Report of PCT/CN2018/114308 in Chinese, dated Feb. 1, 2019, with English translation.
(Continued)

*Primary Examiner* — Bradley Smith
*Assistant Examiner* — David J Goodwin
(74) *Attorney, Agent, or Firm* — Collard & Roe, P.C.

(57) ABSTRACT

A poly-silicon layer and a method of manufacturing the same, methods of manufacturing a thin film transistor, and an array substrate are provided. The method of manufacturing the poly-silicon layer includes forming an amorphous silicon layer, crystallizing the amorphous silicon layer to form a first poly-silicon layer, and processing the first poly-silicon layer to form a second poly-silicon layer using a green laser annealing process.

15 Claims, 4 Drawing Sheets

(51) Int. Cl.
  *H01L 21/02*   (2006.01)
  *H01L 27/12*   (2006.01)
  *H01L 29/66*   (2006.01)

(56) References Cited

U.S. PATENT DOCUMENTS

| | | | | |
|---|---|---|---|---|
| 6,743,680 | B1 * | 6/2004 | Yu | H01L 21/28211 |
| | | | | 438/285 |
| 9,941,120 | B2 * | 4/2018 | Avdokhin | H01S 3/06754 |
| 2002/0033485 | A1 * | 3/2002 | Morosawa | H01L 29/78621 |
| | | | | 257/72 |
| 2005/0062047 | A1 * | 3/2005 | Nishikawa | H01L 29/78645 |
| | | | | 257/72 |
| 2006/0051910 | A1 * | 3/2006 | Tanabe | H01L 27/11502 |
| | | | | 438/152 |
| 2007/0290200 | A1 * | 12/2007 | Asano | H01L 27/1296 |
| | | | | 257/40 |
| 2008/0068698 | A1 * | 3/2008 | Irizumi | H01L 27/1281 |
| | | | | 359/238 |
| 2009/0215212 | A1 | 8/2009 | Liu et al. | |

FOREIGN PATENT DOCUMENTS

| | | |
|---|---|---|
| CN | 107134483 A | 9/2017 |
| CN | 108615680 A | 10/2018 |

OTHER PUBLICATIONS

Notice of Transmittal of the International Search Report of PCT/CN2018/114308 in Chinese, dated Feb. 1, 2019.

Written Opinion of the International Searching Authority of PCT/CN2018/114308 in Chinese, dated Feb. 1, 2019 with English translation.

* cited by examiner

POLY-SILICON LAYER AND METHOD OF MANUFACTURING THE SAME, METHODS OF MANUFACTURING THIN FILM TRANSISTOR AND ARRAY SUBSTRATE

CROSS REFERENCE TO RELATED APPLICATIONS

This application is the National Stage of PCT/CN2018/114308 filed on Nov. 7, 2018, which claims priority under 35 U.S.C. § 119 of Chinese Application No. 201810402853.6 filed on Apr. 28, 2018, the disclosure of which is incorporated by reference.

TECHNICAL FIELD

Embodiments of the present disclosure relate to a poly-silicon layer and a method of manufacturing the same, methods of manufacturing a thin film transistor and an array substrate.

BACKGROUND

Compared with amorphous silicon, poly-silicon has higher carrier mobility and stability, and the carrier mobility of the poly-silicon can reach dozens or even hundreds of times of the amorphous silicon. In order to meet a wider range of application requirements, such as lower temperature preparation conditions, Low Temperature Poly-Silicon (LTPS) technology has been rapidly developed. The grain size and uniformity of the poly-silicon layer are important factors affecting the carrier mobility. How to obtain a poly-silicon layer with a large grain size and higher grain uniformity is a problem in the art.

SUMMARY

At least one embodiment of the present disclosure provides a method of manufacturing a poly-silicon layer, comprising: forming an amorphous silicon layer; crystallizing the amorphous silicon layer to form a first poly-silicon layer; and processing the first poly-silicon layer to form a second poly-silicon layer using a green laser annealing process.

For example, the crystallizing comprises crystallizing the amorphous silicon layer to form the first poly-silicon layer using an excimer laser annealing process.

For example, the excimer laser adopted in the excimer laser annealing process has an energy density ranging from about 260 J/cm$^2$ to about 340 J/cm$^2$.

For example, the first poly-silicon layer has an average grain size ranging from about 180 nm to about 200 nm.

For example, the green laser annealing process comprises scanning the first poly-silicon layer by a green laser.

For example, the green laser has a wavelength ranging from about 500 nm to about 560 nm and an energy density ranging from about 300 mJ/cm$^2$ to about 400 mJ/cm$^2$.

For example, the second poly-silicon layer has an average grain size ranging from about 300 nm to about 320 nm.

For example, grain sizes of the second poly-silicon layer has a standard deviation less than about 80 nm.

For example, the method further comprises de-hydrogenating the amorphous silicon layer before the crystallizing.

For example, the method further comprises providing a substrate, forming a buffer layer on the substrate before forming the amorphous silicon layer, and forming the amorphous silicon layer on the buffer layer.

An embodiment of the present disclosure also provides a poly-silicon layer manufactured by the method.

For example, the method of manufacturing the thin film transistor comprises: forming a gate electrode, a poly-silicon active layer, a gate insulating layer, a source electrode and a drain electrode. The poly-silicon active layer is formed by the method manufacturing the poly-silicon layer.

For example, the method of manufacturing a thin film transistor further comprises doping the poly-silicon active layer with the gate electrode as a mask after forming the gate electrode.

An embodiment of the present disclosure also provides a method of manufacturing an array substrate, the array substrate comprising a plurality of thin film transistors arranged in an array. The method comprises preparing the plurality of thin film transistors by the method of manufacturing the thin film transistor.

BRIEF DESCRIPTION OF THE DRAWINGS

In order to clearly illustrate the technical solution of the embodiments of the disclosure, the drawings of the embodiments will be briefly described in the following; it is apparent that the described drawings are only related to some embodiments of the disclosure and are not limitative of the disclosure.

DETAILED DESCRIPTION

Technical solutions of the embodiments will be described in a clearly and fully understandable way in connection with the drawings related to the embodiments of the disclosure. It is apparent that the described embodiments are a part but not all of the embodiments of the disclosure. Based on the described embodiments herein, one of ordinary skill in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not preclude other elements or objects. The terms, 'on,' 'under,' 'left,' 'right,' or the like are only used to indicate relative position relationship, and when the absolute position of the object which is described is changed, the relative position relationship may be changed accordingly.

Inventors noticed that increasing the grain size and grain uniformity (i.e., reducing the grain roughness) of the low temperature poly-silicon film (crystallization temperature below 600 degrees Celsius) can improve the mobility of carriers and the performance of devices (such as thin film transistors) to which the low temperature poly-silicon layer is applied. However, the grain size and grain uniformity of the poly-silicon layer are a pair of mutually constrained parameters in the preparation of the low temperature poly-silicon layer. For example, when the low temperature poly-silicon layer is prepared by using an Excimer Laser Annealing (ELA) process, smaller grain size and better grain uniformity will be generated by a low laser energy density; when the laser energy density increases, the grain size will increase, but the uniformity of the grain size will also deteriorate.

An embodiment of the present disclosure provides a method of manufacturing a poly-silicon layer, which crystallizes the poly-silicon layer twice to obtain a poly-silicon layer with excellent grain size and uniformity using a green Laser Annealing (GLA) process.

Hereinafter, a poly-silicon layer and a method of manufacturing the same, methods of manufacturing a thin film transistor and an array substrate provided by embodiments of the present disclosure will be described with reference to the accompanying drawings.

Figure 1:
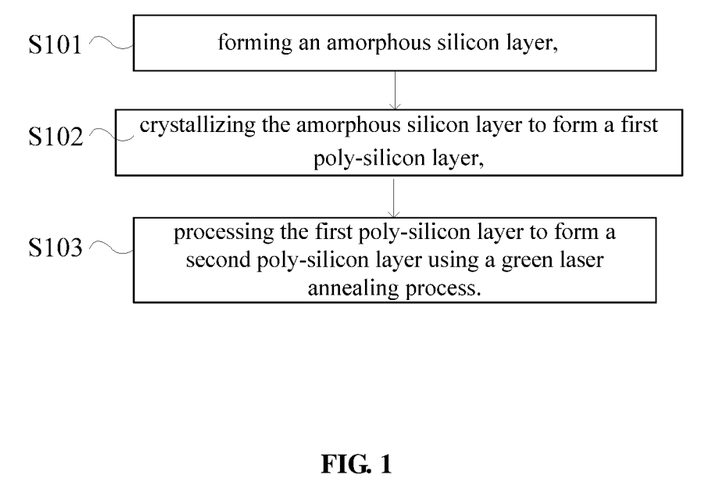
FIG. 1 is a flow chart illustrating steps of a manufacturing method of a poly-silicon layer provided by an embodiment of the present disclosure.
Figure 2A:
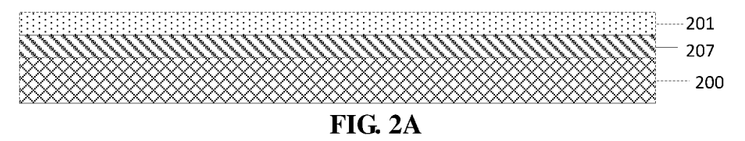
FIG. 2A-2C are schematic views illustrating respective structures formed in a process of manufacturing the poly-silicon layer provided by an embodiment of the present disclosure.
Figure 2B:
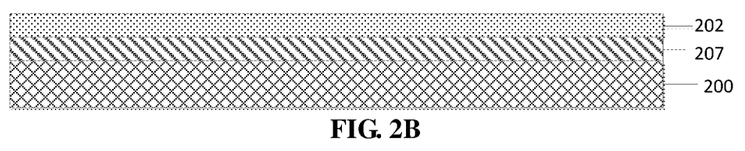
Figure 2C:
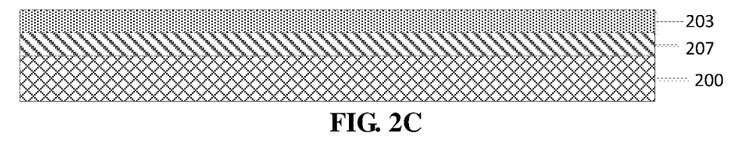

FIG. 1 is a schematic diagram illustrating steps of a manufacturing method of a poly-silicon layer provided by an embodiment of the present disclosure, and FIGS. 2A-2C are schematic diagrams illustrating respective structures formed during a manufacturing process of the poly-silicon layer according to an embodiment of the present disclosure. As illustrated in the Figure, the manufacturing method may comprise the following steps.

S101: forming an amorphous silicon layer 201.

As illustrated in FIG. 2A, the amorphous silicon layer 201 is formed on a substrate 200.

For example, the substrate 200 may be an inorganic substrate (such as glass substrate, quartz substrate, sapphire substrate, silicon wafer, etc.) or an organic flexible substrate (such as polyimide (PI) substrate, polyethylene terephthalate (PET) substrate, polycarbonate substrate, polyacrylate substrate, polyetherimide substrate, polyether sulfone substrate, etc.), but embodiments include but are not limited thereto.

For example, the amorphous silicon layer 201 may be formed by using a physical vapor deposition process (e.g., sputtering) and a chemical vapor deposition process.

For example, the amorphous silicon layer is formed by using a plasma enhanced chemical vapor deposition process. The corresponding reaction gas may comprise a mixture of silane and hydrogen, or a mixture of silane and phosphine.

For example, when the amorphous silicon layer is formed by using the plasma enhanced chemical vapor deposition (PECVD) process, the process conditions include: a gas pressure of about 2000 mTorr, a temperature of about 350° C. to about 400° C., a radio frequency power of about 100 W, and the reaction gas comprises silane and hydrogen, but embodiments of the present disclosure are not limited thereto.

For example, the amorphous silicon layer has a thickness of about 40 nanometers to about 80 nanometers.

For example, in at least one embodiment, the manufacturing method may further comprise forming a buffer layer 207 on the substrate before forming the amorphous silicon layer. For example, the buffer layer may be used to improve the flatness of the surface of the substrate, and prevent impurities (such as metal ions) in the substrate 200 from diffusing into the amorphous silicon layer to affect the properties of the material. However, the buffer layer may not be formed.

For example, the buffer layer may be a single layer structure of a silicon nitride or silicon oxide material, or may be a stacked structure of silicon nitride and silicon oxide.

For example, the buffer layer has a thickness of about 200 nanometers to about 400 nanometers.

S102: crystallizing the amorphous silicon layer 201 to form a first poly-silicon layer 202, as illustrated in FIG. 2B.

For example, the crystallizing comprises a crystallization process, such as an excimer laser annealing crystallization process, a metal induced crystallization (MIC) process (such as metal lateral induced crystallization (MILC)), a solid phase crystallization (SPC) process, and a Sequential Lateral Solidification (SLC) process. Embodiments of the present disclosure are not limited thereto.

For example, the amorphous silicon layer is crystallized by using the excimer laser annealing crystallization process to form the first poly-silicon layer 202.

Excimer laser annealing refers to irradiating the amorphous silicon layer with an excimer laser to melt the amorphous silicon, and the liquid amorphous silicon is crystallized upon cooling, in this way, the transition of the amorphous silicon layer to the poly-silicon layer is realized.

For example, the first poly-silicon layer is formed at a lower laser energy density such that the first poly-silicon layer has a smaller grain size and higher grain uniformity.

For example, the excimer laser annealing process may employ an excimer laser, such as xenon chloride (XeCl) (wavelength of about 308 nm), krypton fluoride (KrF) (wavelength of about 193 nm), or argon fluoride (ArF) (wavelength of about 248 nm).

For example, the conditions of the excimer laser annealing process include: a laser pulse frequency of about 100 Hz to about 400 Hz, a laser overlap ratio of about 90% to about 98%, and a laser energy density ranging from about 260 $J/cm^2$ to about 340 $J/cm^2$.

For example, the first poly-silicon layer has an average grain size ranging from about 180 nm to about 200 nm.

Step S103: processing the first poly-silicon layer 202 to form a second poly-silicon layer 203 using a green laser annealing process, as illustrated in FIG. 2C.

Compared with a conventional annealing process (for example, an annealing process using an annealing furnace), the green laser annealing process has advantages of short time-consuming and high efficiency. In at least one example, the green laser annealing process employs a solid light source, which has lower operating costs and higher equipment utilization rates than a laser annealing process using a gas light source (such as the excimer laser annealing process). The poly-silicon layer has a higher absorption efficiency for the laser band of the green laser annealing process.

For example, the green laser annealing process comprises irradiating the first poly-silicon layer with the green laser having a wavelength ranging from about 500 nm to about 560 nm, an energy density ranging from about 300 $mJ/cm^2$ to about 400 $mJ/cm^2$, a laser pulse frequency of about 10 kHz and a pitch of about 1 μm to about 2 μm, in which the pitch is the distance that the object irradiated by the laser moves within one pulse time. In this embodiment, the first poly-silicon layer 202 is provided on the substrate 200 and irradiated by the green laser, and the substrate is moved by a distance of about 1 μm to about 2 μm in one laser pulse time.

For example, in order to increase the energy absorption efficiency of the first poly-silicon layer to the laser beam, the green laser annealing process employs a wavelength of about 532 nm. For example, the light beam of the green laser light may be a point beam or a linear beam, etc., and embodiments of the present disclosure are not limited thereto.

By forming a first poly-silicon layer having a uniform grain of small size under a lower energy density condition, and then performing a low energy density scan on the first poly-silicon layer using the green laser annealing process, the grains in the first poly-silicon layer can be uniformly grown, and a poly-silicon layer having excellent grain size and grain uniformity is obtained.

For example, the uniformity of the poly-silicon layer grains may be measured by calculating the standard deviation (δ) of the grain sizes of the poly-silicon layer. The standard deviation (δ) is defined as the square root of the arithmetic mean value of the square of the difference between the sum value of various units and its mean value, which reflects the degree of dispersion among individuals within a group. The smaller the standard deviation is, the smaller the difference between most of the values and their mean is. For a set of values $x_i$ (i=1, 2, . . . N) whose arithmetic mean is μ, the standard deviation is calculated by:

$$\delta = \sqrt{\frac{1}{N} \Sigma \sum_{i=1}^{N} (x_i - \mu)^2}.$$

In an embodiment of the present disclosure, the individual grain size in the second poly-silicon layer can be represent by $x_i$, and the standard deviation of the grain sizes of the second poly-silicon layer can be calculated, thereby obtaining an indication of grain uniformity of the second poly-silicon layer. The smaller the value of the standard deviation is, the more uniform the grains of the second poly-silicon layer are.

For example, the second poly-silicon layer 203 obtained by the above-described manufacturing method may have an average grain size ranging from about 300 nm to about 320 nm and a standard deviation of the grain size less than about 80 nm.

For example, in at least one example, the manufacturing method further comprises dehydrogenating the amorphous silicon layer 201 before crystallizing the amorphous silicon layer 201. The residual hydrogen in the amorphous silicon layer is removed by the dehydrogenating process to prevent the hydrogen in the amorphous silicon layer from overflowing in the subsequent crystallization process, which causes a hydrogen explosion to roughen the surface of the amorphous silicon layer.

For example, the dehydrogenating process comprises annealing the amorphous silicon layer in an annealing furnace.

At least one embodiment of the present disclosure also provides a poly-silicon layer which is manufactured by the above-described manufacturing method.

For example, the poly-silicon layer has an average grain size ranging from about 300 nm to about 320 nm and a standard deviation (δ) of grain sizes less than about 80 nm.

At least one embodiment of the present disclosure also provides a method of manufacturing a thin film transistor, comprising forming a gate electrode, a poly-silicon active layer, a gate insulating layer, a source electrode and a drain electrode, in which the poly-silicon active layer is formed by the above-described manufacturing method.

It should be understood that, for example, the thin film transistor of a top gate electrode structure, a bottom gate electrode structure or a double gate electrode structure may be formed by appropriately changing the order in which the gate electrode and the poly-silicon active layer are formed. It should be understood by those skilled in the art that as long as the poly-silicon active layer of the thin film transistor is formed by the manufacturing method of the poly-silicon layer provided by the embodiment of the present disclosure, the thin film transistor and the manufacturing method thereof are all within the protection scope of the present disclosure.

Figure 3:
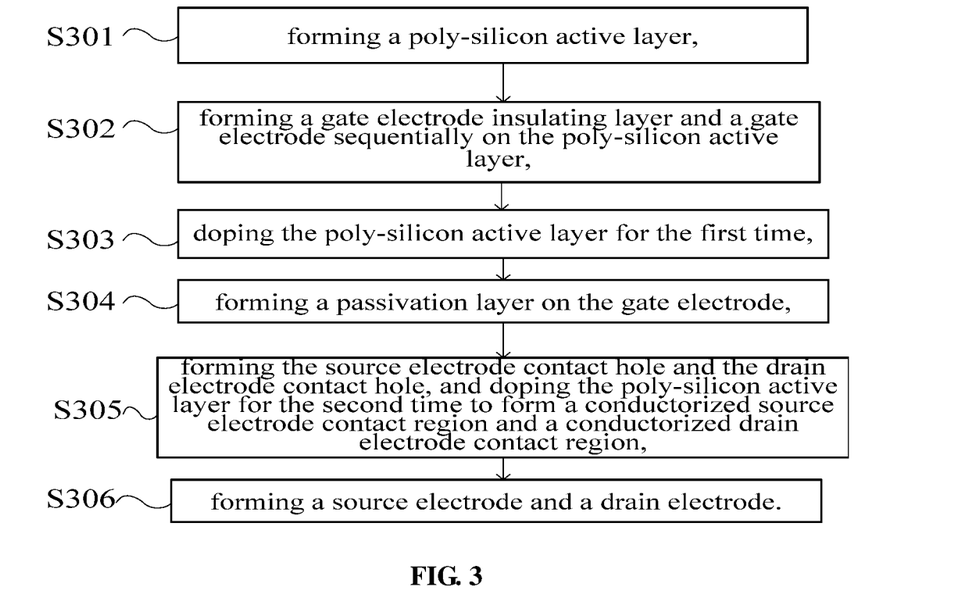
FIG. 3 is a flow chart illustrating steps of a manufacturing method of a thin film transistor provided by an embodiment of the present disclosure.

FIG. 3 is a flow chart illustrating the steps of a manufacturing method of the thin film transistor 300 provided by at least one embodiment of the present disclosure. FIGS. 4A-4D are schematic diagrams illustrating respective structures formed during the manufacturing process of the thin film transistor 300, and the thin film transistor comprises a poly-silicon active layer 302 formed by the above-described manufacturing method of the poly-silicon layer.

Hereinafter, a manufacturing method of a thin film transistor provided by an embodiment of the present disclosure will be described in detail with reference to FIGS. 3 and 4A-4D by taking the formation of the bottom gate electrode type thin film transistor 300 as an example.

As illustrated in FIG. 3, the manufacturing method may comprise the following steps.

Step S301: forming a poly-silicon active layer 302.

Figure 4A:
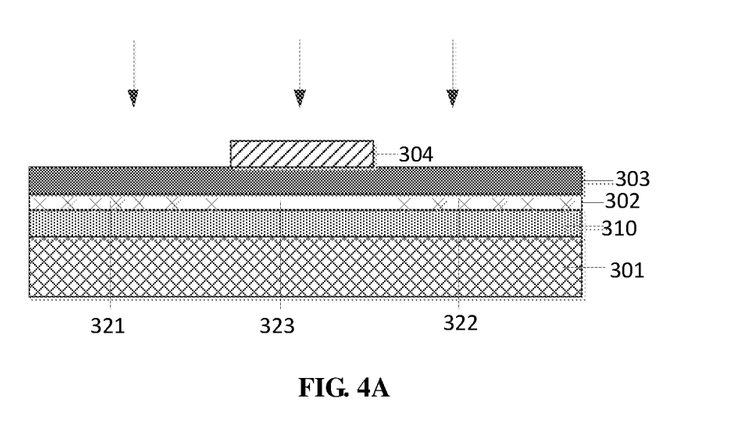
FIG. 4A-4D are schematic views illustrating respective structures formed in a process of manufacturing the thin film transistor provided by an embodiment of the present disclosure.

A poly-silicon active layer 302 which formed by the manufacturing method of the poly-silicon layer provided by the embodiments of the present disclosure is formed on a substrate 301.

For example, the substrate 301 may be an inorganic substrate (such as glass, quartz, sapphire, silicon wafer, etc.) or an organic flexible substrate (such as polyimide (PI), polyethylene terephthalate (PET), polycarbonate, polyacrylate, polyetherimide, polyether sulfone, etc.). The embodiment includes but is not limited thereto.

For example, a poly-silicon layer is formed by the manufacturing method of the poly-silicon layer provided by an embodiment of the present disclosure, and then the poly-silicon layer is patterned to form a poly-silicon active layer 302.

For example, the poly-silicon active layer 302 has a thickness of about 40 nanometers to about 80 nanometers.

For example, the patterning may employ a photolithography process including a series of process steps of coating, exposing, developing, drying, etching and ashing of the photoresist, in which the etching including, for example, drying etching or wet etching. For example, the dry etching may select an etching process, such as plasma etching or reactive ion etching, and the etching gas may select a gas containing fluorine or chlorine, such as $CF_4$, $CHF_3$, $SF_6$, $CCl_2F_2$, or the like, or a mixed gas of these gases and $O_2$. However, embodiments of the present disclosure are not limited thereto.

For example, in at least one example, the manufacturing method further comprises forming a buffer layer 310 on the substrate 301 before forming the poly-silicon layer. The buffer layer serves to improve the flatness of the surface of the substrate and prevent impurities (such as metal ions) in the substrate 301 from diffusing into the poly-silicon layer to affect the performance of the device.

For example, the buffer layer may be a single layer structure of silicon nitride or silicon oxide material, or may be a stacked structure of silicon nitride and silicon oxide.

For example, the buffer layer has a thickness of about 200 nanometers to about 400 nanometers.

Step S302: forming a gate insulating layer 303 and a gate electrode 304 sequentially on the poly-silicon active layer 302.

For example, the gate insulating layer 303 may include an inorganic insulating material, such as silicon nitride, silicon oxynitride, or aluminum oxide, or an organic insulating material, such as acrylic acid or polymethyl methacrylate (PMMA). For example, the gate insulating layer may be a single layer structure or a multilayer structure.

For example, the gate electrode material may include gold (Au), silver (Ag), copper (Cu), aluminum (Al), molybdenum (Mo), magnesium (Mg), titanium (Ti), hafnium (Hf), antimony (Ta) or an alloy material thereof.

Step S303: doping the poly-silicon active layer 302 for the first time.

As illustrated in FIG. 4A, the poly-silicon active layer 302 is doped for the first time by using a gate electrode self-alignment process with the gate electrode 304 as a mask, such that the poly-silicon active layer comprises a source electrode region 321, a drain electrode region 322 and a channel region 323 between the source electrode region and the drain electrode region.

For example, the first doping process comprises light doping the poly-silicon active layer 302. For example, the light doping is an N-type doping in which the poly-silicon active layer 302 is doped with phosphorus (P) having a concentration of less than about $1\times10^{15}$ cm$^{-3}$.

For example, the poly-silicon active layer 302 may be doped for the first time by an ion implantation process, and an annealing process may be performed to reduce lattice damage caused by the ion implantation process after the process.

Step S304: forming a passivation layer 305 on the gate electrode 304.

For example, the passivation layer 305 may include an inorganic insulating material, such as silicon nitride, silicon oxynitride, or aluminum oxide, or an organic insulating material, such as acrylic acid or polymethyl methacrylate (PMMA). For example, the passivation layer may be a single layer structure or a multilayer structure.

Figure 4B:
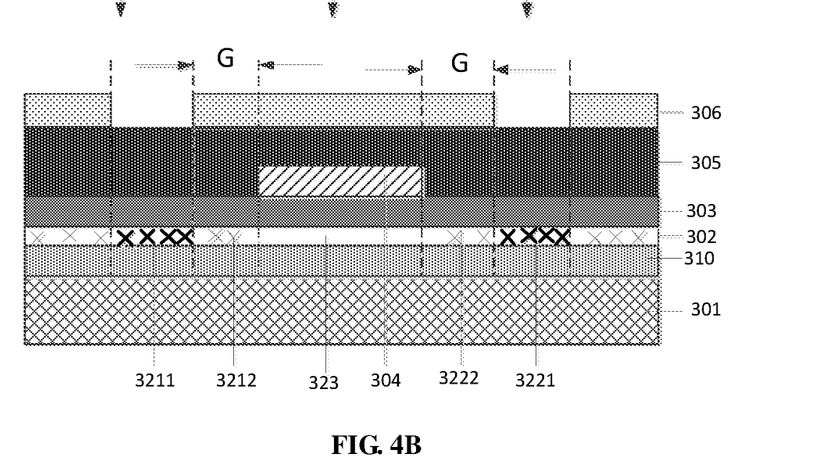

Step S305: forming a source electrode contact hole 351 and a drain electrode contact hole 352, and doping the poly-silicon active layer 302 for the second time to form a conductorized source electrode contact region 3211 and a conductorized drain electrode contact region 3221.

For example, the source electrode contact hole 351 and the drain electrode contact hole 352 may be formed by using a photolithography process. As illustrated in FIG. 4B, a photoresist is formed on the passivation layer, and the photoresist is exposed and developed to form a photoresist layer 306 having a pattern as illustrated in FIG. 4B. The removed part of the photoresist corresponds to the source electrode region 321 and the drain electrode region 322 of the poly-silicon active layer, and has a gap G with the gate electrode in the transverse direction.

The poly-silicon active layer is doped for a second time with the photoresist layer 306 as a mask to form the source electrode contact region 3211 and the drain electrode contact region 3221. The source electrode contact region and the drain electrode contact region are respectively located on two sides of the channel region 323, and have the gap G with the channel region 323.

The second doping is used to form the conductorized source electrode contact region 3211 and the conductorized drain electrode contact region 3221, and the contact resistance between the source electrode and drain electrode of the thin film transistor and the poly-silicon active layer is reduced. For example, the second doping is the same type of doping as the first doping (for example, both are N-type, or P-type), the source electrode contact region 3211 and the drain electrode contact region 3221 become heavily doped conductor regions after the second doping, which enable the source electrode and drain electrode to form an ohmic contact with the poly-silicon active layer to reduce contact resistance.

For example, by doping two times, the source electrode region 321 comprises a source electrode contact region 3211 having a higher doping concentration and a source electrode lightly doped region 3212 (corresponding to the interval G) having a lower doping concentration between the source electrode contact region and the channel region, while the drain electrode region 322 comprises a drain electrode contact region 3221 having a higher doping concentration and a drain electrode lightly doped region 3222 (corresponding to the interval G) having a lower doping concentration between the drain electrode contact region and the channel region, such that a lightly doped drain electrode/source electrode (LDD) structure may be formed. This structure may reduce the hot carrier effect of the thin film transistor and lower the off-state current of the thin film transistor.

Figure 4C:
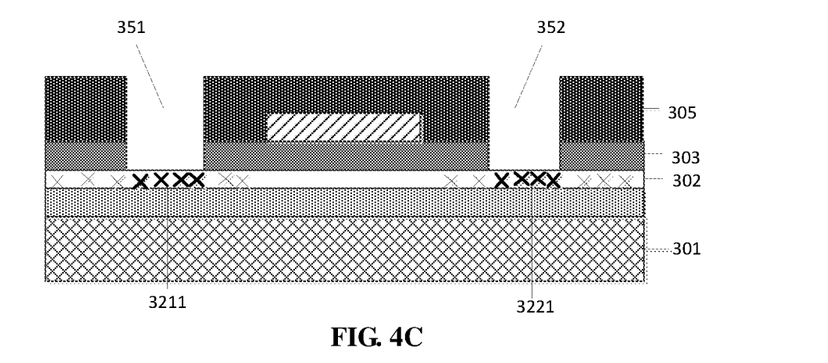

Next, the gate insulating layer 303 and the passivation layer 305 are etched with the photoresist layer 306 as a mask to form the source electrode contact hole 351 and the drain electrode contact hole 352. As illustrated in FIG. 4C, the source electrode contact hole 351 and the drain electrode contact hole 352 penetrate the gate insulating layer and the passivation layer to expose the source electrode contact region 3211 and the drain electrode contact region 3212.

Figure 4D:
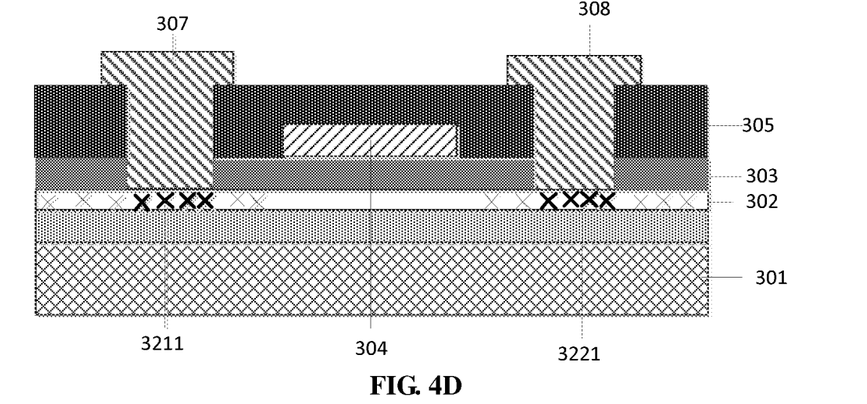

Step S306: forming a source electrode 307 and a drain electrode 308.

As illustrated in FIG. 4D, the source electrode 307 and the drain electrode 308 are formed on the passivation layer 305, and the source electrode and the drain electrode are in contact with the source electrode contact region 3211 and the drain electrode contact region 3212 via the source electrode contact hole 351 and the drain electrode contact hole 352, respectively, which establishes an electrical connection with the poly-silicon active layer.

For example, the source electrode 307 and the drain electrode 308 may be formed by a same conductive material in a single deposition process and obtained through the same patterning process, so that the fabrication of the thin film transistor 300 is completed.

For example, the source electrode and drain electrode materials may include gold (Au), silver (Ag), copper (Cu), aluminum (Al), molybdenum (Mo), magnesium (Mg), titanium (Ti), tantalum (Hf), tantalum (Ta), or an alloy material thereof.

At least one embodiment of the present disclosure also provides a method of manufacturing an array substrate including a plurality of thin film transistors arranged in an array, and the method comprises preparing the plurality of thin film transistors by the above-described manufacturing method.

Figure 5:
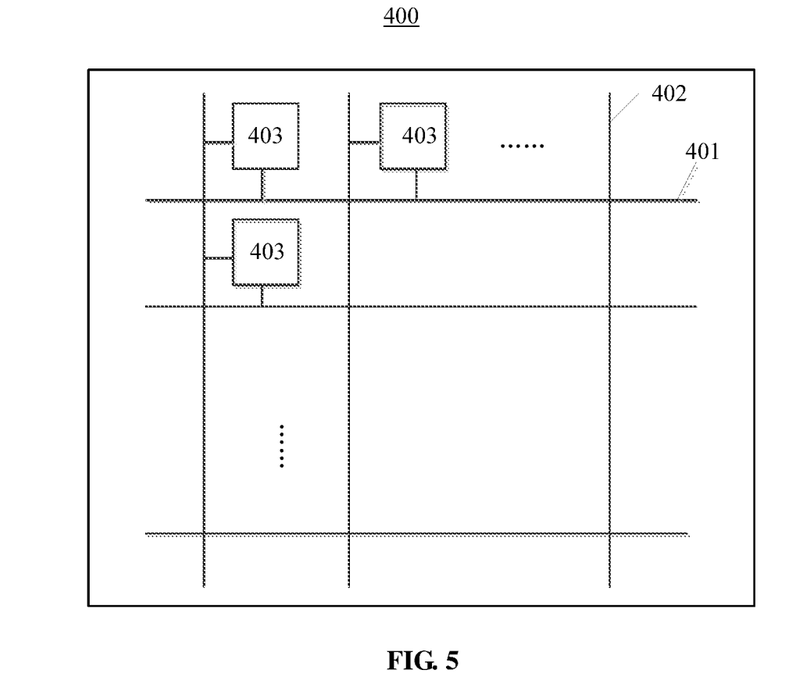
FIG. 5 is a schematic plan view illustrating an array substrate formed by the manufacturing method provided by an embodiment of the present disclosure.
Figure 6:
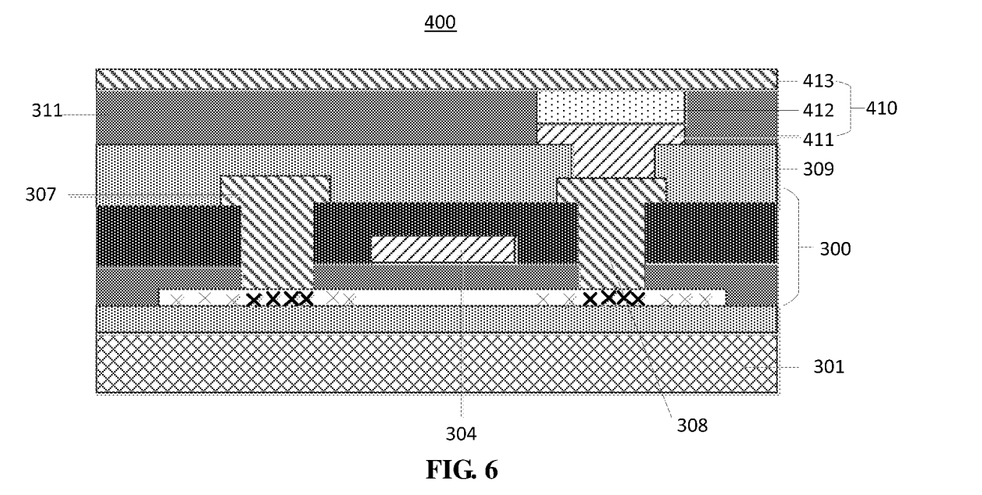
FIG. 6 is a partial cross-sectional view of the array substrate of FIG. 5.

FIG. 5 is a schematic plan view of an array substrate formed by the manufacturing method provided by at least one embodiment of the present disclosure. FIG. 6 is a partial cross-sectional view of the array substrate. For example, the array substrate 400 is an organic light emitting diode array substrate. As illustrated in the Figure, the array substrate 400 comprises a plurality of gate lines 401 and a plurality of data lines 402 which intersect each other to define a plurality of pixel regions in an array, and each of the pixel regions is provided with a pixel unit 403. Each pixel unit 403 includes at least one organic light emitting diode 410 and a pixel circuit connected to the organic light emitting diode, in which the organic light emitting diode emits light under the driving of the pixel circuit. The pixel circuit includes at least one thin film transistor 300. For example, the thin film transistor is a drive transistor directly connected to the organic light emitting diode.

For example, the array substrate may be further provided with a data driving circuit (not shown) for providing a data signal and a gate electrode driving circuit (not shown) for providing a gate electrode signal. The data driving circuit and the gate electrode driving circuit are connected to the pixel unit 403 through the data line 402 and the gate electrode line 401, respectively.

Hereinafter, the method of manufacturing the array substrate provided by an embodiment of the present disclosure will be exemplarily described with reference to FIG. 6. The manufacturing method comprises the following steps.

Step S601: forming a plurality of thin film transistors 300 on the substrate 301 by the manufacturing method of the thin film transistor provided by the embodiment of the present disclosure, and a thin film transistor array structure is formed.

For example, in at least one example, the gate electrode 304 of the thin film transistor 300 is formed together with the gate lines 401 of the array substrate, that is, the gate lines 401 and the gate electrode 304 are formed by a same deposition process and a same patterning process.

For example, in at least one example, the source electrode 307 and the drain electrode 308 of the thin film transistor 300 are formed together with the data lines 402 or the power line (not shown), or the like of the array substrate, that is, the data lines 402, the power line, the source electrode 307 and the drain electrode 308 are formed by a same deposition process and a same patterning process.

Step S602: forming a planarization layer 309 and a first electrode 411 on the source electrode 307 and the drain electrode 308. The first electrode 411 is connected to the drain electrode 308 of the thin film transistor via a hole penetrating through the planarization layer 309.

For example, the planarization layer may be an organic insulating material (such as an acrylic material), an inorganic insulating material (such as an oxide or nitride of silicon) or a stacked structure of an organic insulating material and an inorganic insulating material. For example, the planarization layer may include a single layer material structure or a multilayer material structure.

For example, the first electrode 411 is an anode of the organic light emitting diode 410, and may be, for example, a metal, a conductive metal oxide (such as Indium tin oxide (ITO), or aluminum doped zinc oxide (AZO)), or a stacked structure of a metal and a conductive metal oxide.

It should be understood that the source electrode and the drain electrode of the thin film transistor are interchangeable due to their symmetry in physical structure.

Step S603: forming a Pixel Defining Layer (PDL) 311 on the first electrode 411, and forming an opening which exposes at least a portion of the first electrode 411 on the pixel defining layer 311 by a patterning process to define a light emitting region.

For example, the pixel defining layer is formed of an organic material, such as polyimide (PI), and other organic resins and the like. The forming process comprises, for example, coating a PI solution and curing the PI solution to form a PI layer, and then patterning the PI layer to form the pixel defining layer.

Step S604: sequentially forming an organic light emitting layer 412 and a second electrode 413 corresponding to the opening on the pixel defining layer, and the organic light emitting diode 410 is formed.

For example, the organic light-emitting layer and the second electrode are formed by an evaporation process.

The described above is only exemplary embodiments of the present disclosure; and the present disclosure is not limited thereto. A person of ordinary skill in the art can make various changes and modifications without departing from the scope of the present disclosure, and such changes and modifications shall fall within the scope of the present disclosure.

What is claimed is:

1. A method of manufacturing a poly-silicon layer, comprising:
    forming an amorphous silicon layer;
    crystallizing the amorphous silicon layer to form a first poly-silicon layer; and
    processing the first poly-silicon layer to form a second poly-silicon layer using a green laser annealing process, wherein the crystallizing comprises crystallizing the amorphous silicon layer to form the first poly-silicon layer using an excimer laser annealing process, and the excimer laser adopted in the excimer laser annealing process has an energy density ranging from about 260 J/cm$^2$ to about 340 J/cm$^2$.

2. The method of manufacturing the poly-silicon layer according to claim 1, wherein the first poly-silicon layer has an average grain size ranging from about 180 nm to about 200 nm.

3. The method of manufacturing the poly-silicon layer according to claim 1, wherein the green laser annealing process comprises scanning the first poly-silicon layer by a green laser.

4. The method of manufacturing the poly-silicon layer according to claim 3, wherein the green laser has a wavelength ranging from about 500 nm to about 560 nm and an energy density ranging from about 300 mJ/cm$^2$ to about 400 mJ/cm$^2$.

5. The method of manufacturing the poly-silicon layer according to claim 1, wherein the second poly-silicon layer has an average grain size ranging from about 300 nm to about 320 nm.

6. The method of manufacturing the poly-silicon layer according to claim 1, wherein grain sizes of the second poly-silicon layer has a standard deviation less than about 80 nm.

7. The method of manufacturing the poly-silicon layer according to claim 1, further comprising:
    de-hydrogenating the amorphous silicon layer before the crystallizing.

8. The method of manufacturing the poly-silicon layer according to claim 1, further comprising:
    providing a substrate, and
    forming a buffer layer on the substrate before forming the amorphous silicon layer, wherein the amorphous silicon layer is formed on the buffer layer.

9. A poly-silicon layer manufactured by the method according to claim 1.

10. A method of manufacturing a thin film transistor, comprising:
   forming a gate electrode, a poly-silicon active layer, a gate electrode insulating layer, a source electrode and a drain electrode,
   wherein the poly-silicon active layer is formed by the method according to claim 1.

11. The method of manufacturing the thin film transistor according to claim 10, further comprising:
   doping the poly-silicon active layer with the gate electrode as a mask after forming the gate electrode.

12. A method of manufacturing an array substrate, wherein the array substrate comprises a plurality of thin film transistors arranged in an array, and the method comprises:
   preparing the plurality of thin film transistors by the method according to claim 10.

13. The method of manufacturing the poly-silicon layer according to claim 2, wherein the green laser annealing process comprises scanning the first poly-silicon layer by a green laser.

14. The method of manufacturing the poly-silicon layer according to claim 13, wherein the green laser has a wavelength ranging from about 500 nm to about 560 nm and an energy density ranging from about 300 mJ/cm$^2$ to about 400 mJ/cm$^2$.

15. The method of manufacturing the poly-silicon layer according to claim 14, wherein the second poly-silicon layer has an average grain size ranging from about 300 nm to about 320 nm.

* * * * *